(12) United States Patent
Chen et al.

(10) Patent No.: US 11,984,544 B2
(45) Date of Patent: May 14, 2024

(54) LIGHT-EMITTING ELEMENT AND DISPLAY DEVICE USING THE SAME

(71) Applicant: Lextar Electronics Corporation, Hsinchu (TW)

(72) Inventors: Jih-Kang Chen, Hsinchu (TW); Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 322 days.

(21) Appl. No.: 17/446,170

(22) Filed: Aug. 27, 2021

(65) Prior Publication Data
US 2022/0384693 A1     Dec. 1, 2022

(30) Foreign Application Priority Data

May 26, 2021 (TW) .................................. 110119130

(51) Int. Cl.
| | |
|---|---|
| H01L 33/54 | (2010.01) |
| H01L 25/075 | (2006.01) |
| H01L 25/16 | (2023.01) |
| H01L 27/15 | (2006.01) |
| H01L 33/22 | (2010.01) |
| H01L 33/44 | (2010.01) |
| H01L 33/00 | (2010.01) |

(52) U.S. Cl.
CPC .......... *H01L 33/54* (2013.01); *H01L 25/0753* (2013.01); *H01L 25/167* (2013.01); *H01L 33/0093* (2020.05); *H01L 33/0095* (2013.01); *H01L 2933/005* (2013.01)

(58) Field of Classification Search
CPC ..... H01L 33/54; H01L 33/22; H01L 33/0093; H01L 25/0753; H01L 27/153; H01L 25/167; H01L 27/156; H01L 33/44; H01L 33/46; H01L 33/505
See application file for complete search history.

(56) References Cited

U.S. PATENT DOCUMENTS

| | | |
|---|---|---|
| 9,105,813 B1 | 8/2015 | Chang |
| 10,224,231 B2 | 3/2019 | Bower |

(Continued)

FOREIGN PATENT DOCUMENTS

| | | |
|---|---|---|
| CN | 108110094 A | 6/2018 |
| CN | 110854251 A | 2/2020 |

(Continued)

*Primary Examiner* — Antonio B Crite
(74) *Attorney, Agent, or Firm* — CKC & Partners Co., LLC

(57) ABSTRACT

A light-emitting element includes light-emitting diode (LED) chip with a first and second surface opposite to each other, and sidewalls connecting the first and second surface. The light-emitting element further includes a first insulation layer disposed on and covering the first surface and one part of the sidewalls. The light-emitting element further includes multiple connection pads physically contact the first surface and protruding from the first insulation layer, as well as a second insulation layer disposed on and covering the second surface and the other part of the sidewalls. The second insulation layer includes a cover portion and protrusion portions. The cover portion covers the whole second surface and the other part of the sidewalls. The protrusion portions are disposed on the sidewalls, protrude from the cover portion and extend laterally.

18 Claims, 18 Drawing Sheets

(56) References Cited

U.S. PATENT DOCUMENTS

| | | |
|---|---|---|
| 2019/0051552 A1 | 2/2019 | Bower et al. |
| 2019/0181181 A1* | 6/2019 | Yeon .................. H01L 25/0753 |
| 2020/0403114 A1 | 12/2020 | Meng et al. |
| 2021/0020491 A1 | 1/2021 | Trindade et al. |

FOREIGN PATENT DOCUMENTS

| | | |
|---|---|---|
| CN | 111276470 A | 6/2020 |
| CN | 112133795 A | 12/2020 |
| JP | 2016167512 A | 9/2016 |
| TW | I466320 B | 12/2014 |
| TW | I625871 B | 6/2018 |
| TW | 202042415 A | 11/2020 |
| TW | 202044616 A | 12/2020 |
| TW | 202118111 A | 5/2021 |

\* cited by examiner

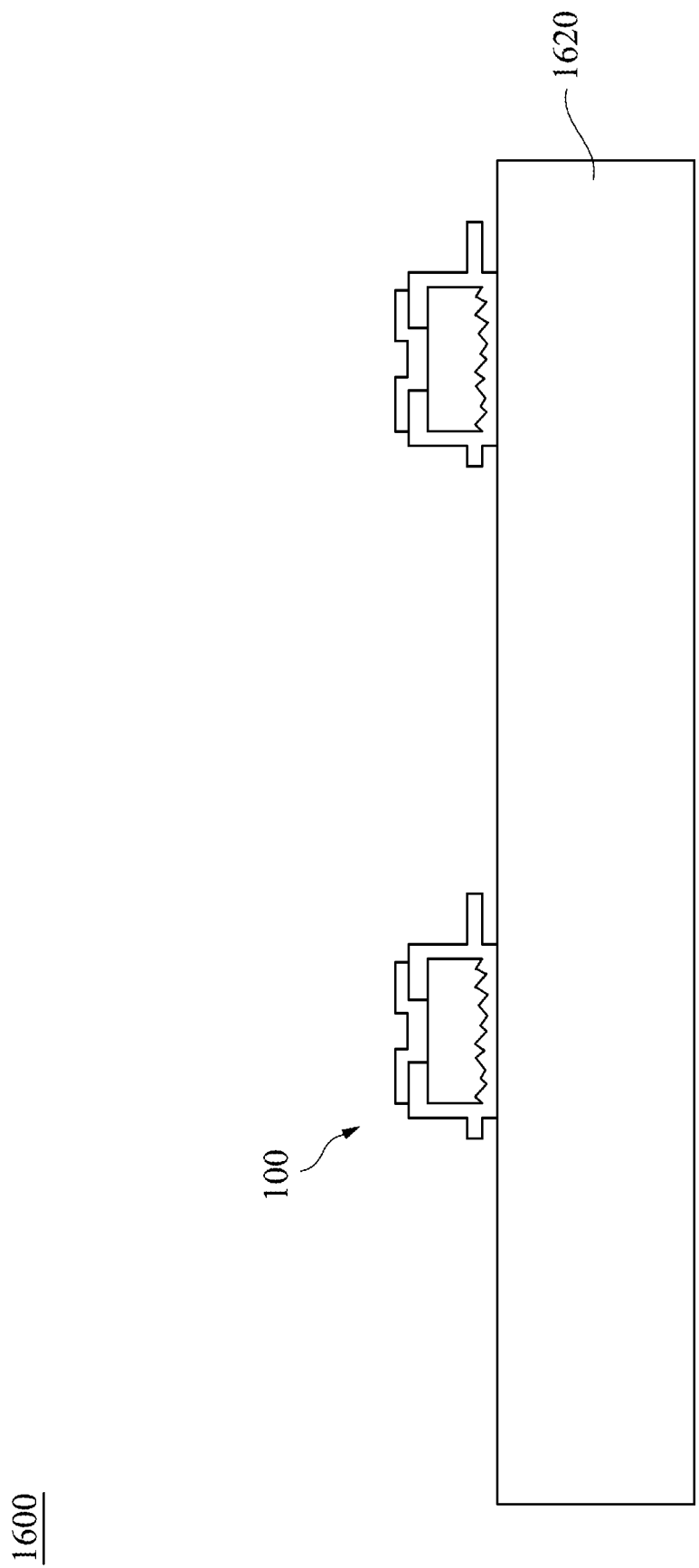

LIGHT-EMITTING ELEMENT AND DISPLAY DEVICE USING THE SAME

CROSS-REFERENCE TO RELATED APPLICATION

This application claims priority to Taiwan Application Serial Number 110119130, filed May 26, 2021, which is herein incorporated by reference in its entirety.

BACKGROUND

Field of Invention

The present invention relates to a light-emitting diode (LED) and a display device therewith. More particularly, the present invention relates to a light-emitting element of the light-emitting diode and the display device equipped therewith.

Description of Related Art

The light-emitting diode (LED) is a type of semiconductor device. Development of LEDs has been vigorous for its advantages including small size, luminescence, prompt reaction time, long life time, and low power consumption.

The micro LED is a light-emitting device with size reduced to micrometer scale. During the manufacture of display devices, micro LEDs are transferred onto another substrate (e.g., carrier substrate) in a method of mass transfer. To enhance reliability of manufacture, an insulation layer is disposed to cover micro LED as a protection layer.

SUMMARY

An aspect of the present disclosure provides a light-emitting element. The light-emitting element includes a light-emitting diode chip. The light-emitting diode chip has a first and second surface opposite to each other and sidewalls connecting the first and second surface. The light-emitting element further includes a first insulation layer disposed on and covering the first surface and a first part of the sidewalls. The light-emitting element further includes multiple connection pads physically contact the first surface and protruding from the first insulation layer, as well as a second insulation layer disposed on and covering the second surface and a second part of the sidewalls. The second insulation layer includes a cover portion and protrusion portions. The cover portion covers the whole second surface and the second part of the sidewalls. The protrusion portions are disposed on the sidewalls, protrude from the cover portion and extend laterally.

An aspect of the present disclosure provides a display device including a carrier substrate and a plurality of light-emitting elements disposed on the carrier substrate. The light-emitting elements are any light-emitting elements provided in the present disclosure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

FIGS. 2, 3, 4, 5, 6, 7, 8, 9, 10, 11, 12, 13, 14, 15, and 16 are cross-sectional views of the light-emitting element in intermediate stages with reference cross section taken along line B-B of FIG. 1A according to some embodiments of the present disclosure.

DETAILED DESCRIPTION

Figure 1A:
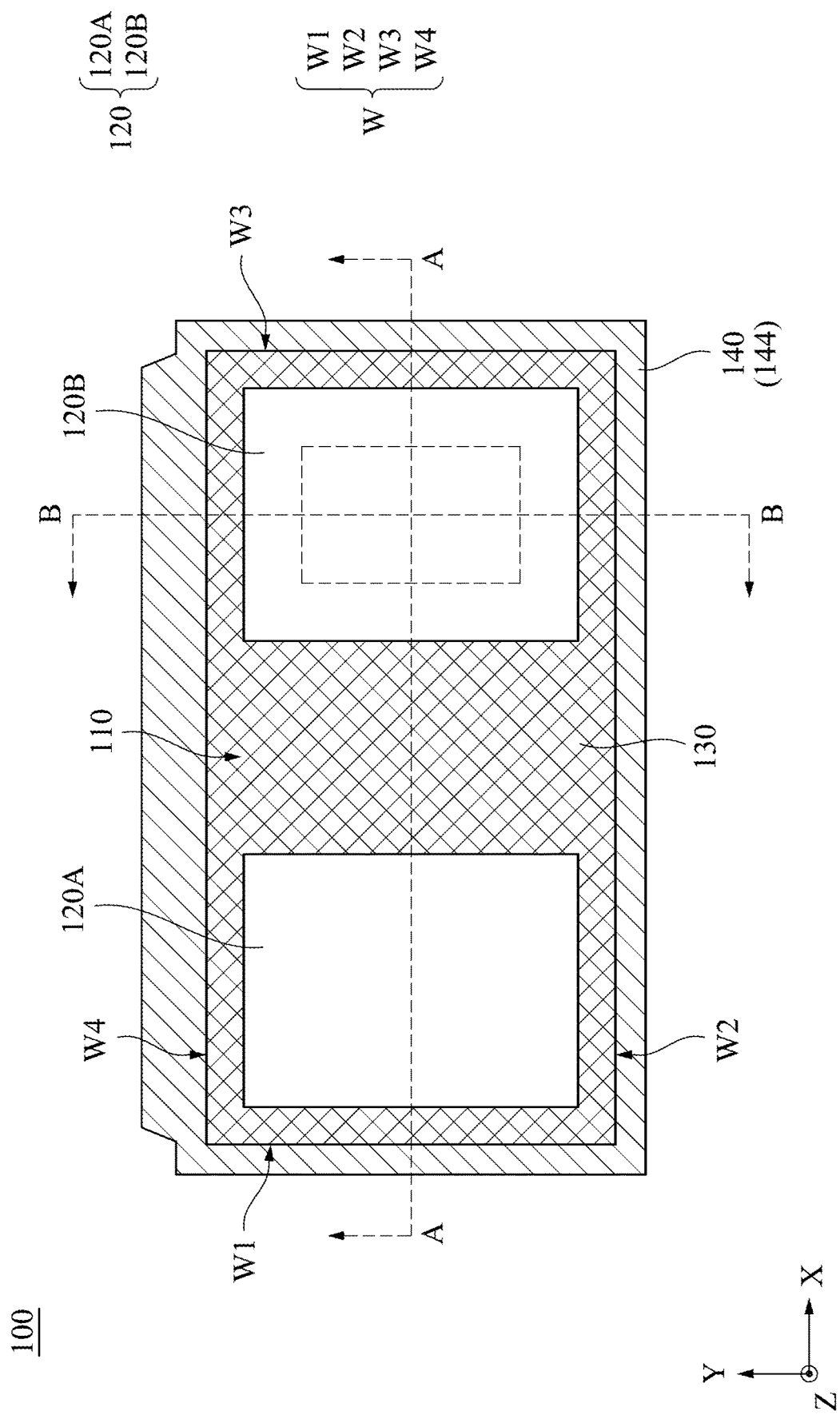
FIG. 1A is a top view of a light-emitting element according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following disclosure provides many different embodiments, or examples, for implementing different features of the invention. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The micro light-emitting diode (LED) is a light-emitting device with size reduced to micrometer scale and is solo produced in a chip form. During the manufacture of display devices, micro LEDs are transferred onto another substrate (e.g., carrier substrate) in a method of mass transfer.

In a conventional LED structure, connection pads are configured on a LED chip to electrically connect the LED chip with external units. To protect the LED chip and decrease a risk of leakage, an insulation layer is used to overlay on a portion of semiconductor surface of the LED chip. The present disclosure provides a structure of a light-emitting element and a method to entirely cover the semiconductor surface of the LED chip by alternating processes of flipping and coating, thereby increasing reliability of the product and the manufacture.

Figure 1B:
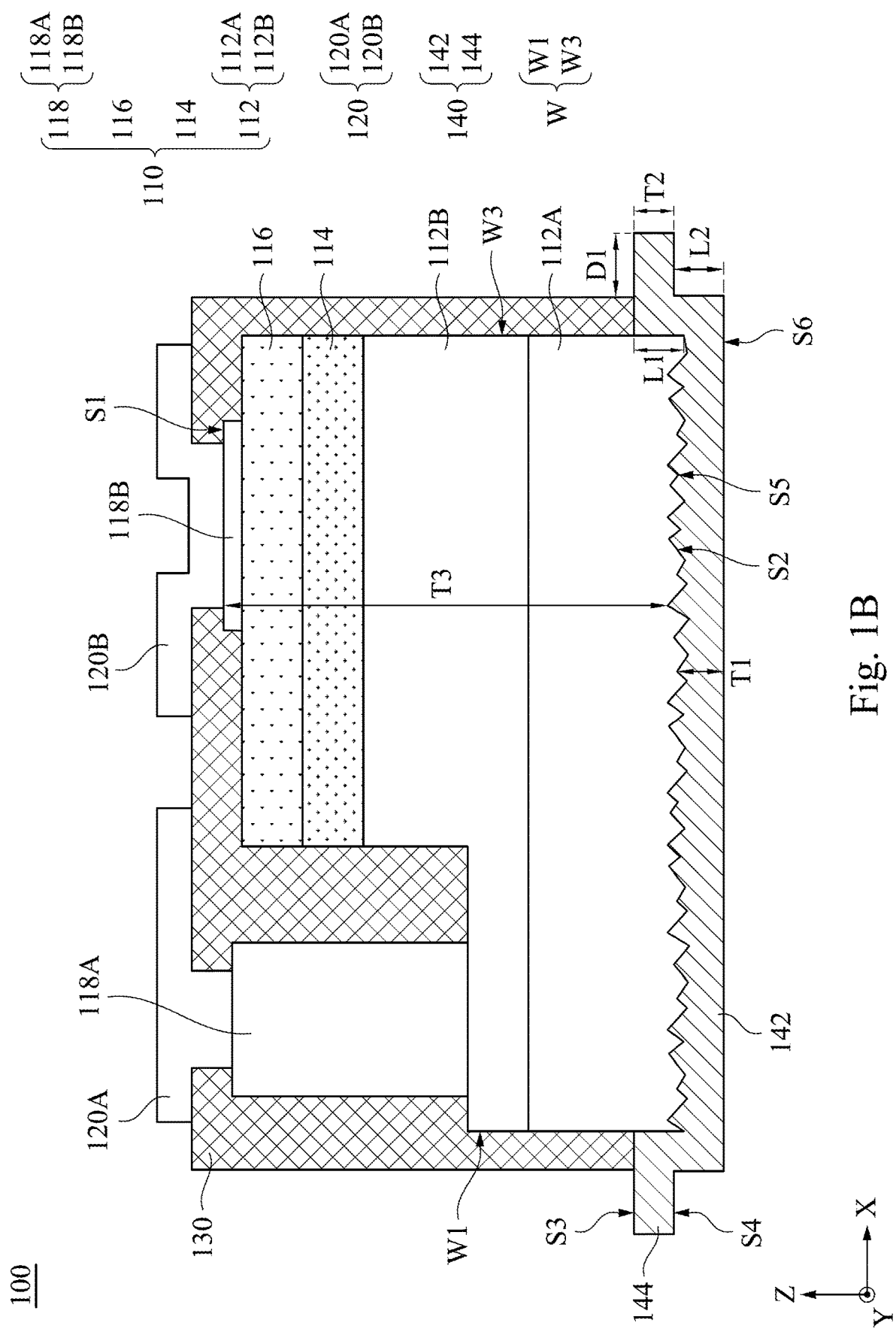
FIG. 1B is a cross-sectional view of the light-emitting element taken along line A-A of FIG. 1A according to some embodiments of the present disclosure.

Referring to FIG. 1A and FIG. 1B, FIG. 1A is a top view of a light-emitting element 100 according to some embodiments of the present disclosure, and FIG. 1B is a cross-sectional view of the light-emitting element 100 taken along line A-A of FIG. 1A according to some embodiments of the present disclosure.

As shown in FIG. 1A, the light-emitting element 100 has a light-emitting diode (LED) chip 110, multiple connections pads 120 disposed on the LED chip 110, a first insulation layer 130 covering the LED chip 110, and a second insulation layer 140 covering the LED chip 110. It is noted that the second insulation layer 140 can partly be observed in FIG. 1A due to the observation direction of FIG. 1A. That is, only protrusion portions 144 (the detail in FIG. 1B) of the second insulation layer 140 is observed in FIG. 1A.

The LED chip 110 has a first surface S1, a second surface S2 opposite to the first surface S1, and multiple sidewalls W (e.g., sidewall W1, W2, W3 and W4) connecting the first and second surfaces S1/S2. The connection pads 120 are disposed on the first surface S1. In some embodiments, the second surface S2 of the LED 110 has a rough texture. In some embodiments, the rough texture of the second surface S2 can be a regular pattern. In some embodiments, the rough texture of the second surface S2 can be a random pattern or an irregular pattern. In some embodiments, the second surface S2 is a light-emitting surface.

The LED chip 110 may be a multilayer structure formed by a first semiconductor layer 112, a light-emitting layer 114 and a second semiconductor layer 116 in sequence. In some embodiments, the first semiconductor layer 112 includes an undoped semiconductor layer 112A and doped semiconductor layer 112B. The second surface S2 is on the undoped semiconductor layer 112A, the doped semiconductor layer 112B is located between the undoped semiconductor layer 112A and the light-emitting layer 114. In some other embodiments, the second surface S2 may be on the doped semiconductor layer 112B when the undoped semiconductor layer 112A is not applied.

In some embodiments, the first semiconductor layer 112 can be III-V group semiconductor layer. For instance, the III-V semiconductor layer may include a binary epitaxial material such as GaAs, GaN, GaP, InAs, AlN, InN, and InP, or a ternary or quaternary epitaxial material such as AlGaN, AlGaAs, InGaP, InGaN, AlInGaN, AlInGaP, and InGaAsP. In some embodiments, the undoped semiconductor layer 112A may be an undoped III-V group semiconductor layer, and the doped semiconductor layer 112B may be N-type III-V group semiconductor layer. The N-type III-V group semiconductor layer may be formed by doping a IVA group element (such as silicon) into the III-V group semiconductor layer mentioned above.

The light-emitting layer 114 is disposed on the first semiconductor layer 121. In some embodiments, the light-emitting layer 114 may include a multiple quantum well (MQW), a single-quantum well (SQW), a homojunction, a heterojunction, or other similar structures, but the present disclosure is not limited thereto. In some embodiments, a light generated from the light-emitting layer 114 may pass through the second surface S2.

The second semiconductor layer 116 is disposed on the light-emitting layer 114, and has a different doping type from the first semiconductor layer 112. In some embodiments where the first semiconductor layer 112 is an N-type III-V group semiconductor layer, the second semiconductor layer 116 may be a P-type III-V group semiconductor layer mentioned above. Similarly, in some other embodiments where the first semiconductor layer 112 is a P-type III-V group semiconductor layer, the second semiconductor layer 116 may be a N-type III-V group semiconductor layer mentioned above.

In some embodiments of the LED with GaN, the undoped semiconductor layer 112A includes undoped GaN (u-GaN), the doped semiconductor layer 112B includes N-type GaN (n-GaN), the second semiconductor layer 116 includes P-type GaN (p-GaN), and the light-emitting layer 114 may be MQW formed by alternating layers of InGaN layers and GaN layers.

In a case that the undoped semiconductor layer 112A is omitted, the doped semiconductor layer 112B may be a P-type GaP, and the second semiconductor layer 116 may be an N-type AlGaInP.

The LED chip 110 further includes electrodes 118. A first electrode 118A and a second electrode 1186 of the electrodes 118 are respectively connected to corresponding the first semiconductor layer 112 and the second semiconductor layer 116 in the LED chip 110. The electrodes 118 include any suitable conductive material, such as metal oxide (i.e., indium tin oxide (ITO), IZO, AZO), metal (i.e., Ti, Ni, Al, Au, Pt, Cr, Ag, Cu), and metal alloy.

The first insulation layer 130 is configured on the first surface S1 and a first part of the sidewalls W of the LED chip 110. Specifically speaking, the first insulation layer 130 may cover the first semiconductor layer 112, light-emitting layer 114 and the second semiconductor layer 116 to provide functions of electrical insulation, protection and light reflection. Further, since the connection pads 120 are later formed on the electrodes 118 for electrical connection, the first insulation layer 130 partly cover the electrodes 118. The first insulation layer 130 may include silicon oxide, aluminum oxide, titanium oxide, hafnium oxide, silicon nitride, or a stack of two materials with different refractive index.

The connection pads 120 are configured on the first surface S1, and include a first connection pad 120A and a second connection pad 120B which are separated from each other. In further descriptions, the connection pads 120 are in contact with the first surface S1 and protrude from the first insulation layer 130. In some embodiments, a part of connection pads 120 are disposed on the first insulation layer 130. Based on the design of the product, the first connection pad 120A is in contact with the first electrode 118A to be connected to the first semiconductor layer 112, and the second connection pad 120B is in contact with the second electrode 118B to be connected to the second semiconductor layer 116. The connection pads 120 may include Al, Cu, Ni, Au, Pt, Ti, any suitable metal, or a combination thereof.

The second insulation layer 140 is configured on the second surface S2 and a second part of sidewalls W of the LED chip 110. In some embodiments, the second part of the sidewalls W where the second insulation layer 140 is configured could partly overlap with the first part of the sidewalls W where the first insulation layer 130 is configured (not illustrated). In some other embodiments, the first part of the sidewalls W is one part of the sidewalls W and the second part of the sidewalls W is the other part of the sidewalls W, as shown in FIG. 1B.

The second insulation layer 140 includes a cover portion 142 and multiple protrusion portions 144. The cover portion 142 cover the whole second surface S2 and the second part of the sidewalls W (e.g., a length L1). The protrusion portions are disposed on the sidewalls W, protrude from the cover portion 142 and extend laterally (e.g., along X direction). The protrusion portions 144 may be around the LED chip 110. In another words, the protrusion portions 144 may be disposed on the sidewall W1, W2, W3, and W4. In some embodiments, the protrusion portions 144 may be connected to each other continuously around the LED chip 110, as shown in FIG. 1A.

In some embodiments, a thickness T1 of the cover portion 142 is in a range from about 0.5 micrometers (μm) to about 2.0 μm. When the thickness T1 is below the above-noted lower limits, the cover portion 142 of the second insulation layer 140 may not perform the function of electrical insulation well. When the thickness T1 is greater than the above-noted upper limits, the cover portion 142 may have an unfavorable influence on illumination efficiency passing from the second surface S2. In some embodiments, a thickness T2 of the protrusion portions 144 is in a range from about 0.5 μm to about 2.0 μm. In some embodiments, the thickness T1 of the cover portion 142 substantially equals to the thickness T2 of the protrusion portions 144.

A protrusion length D1 of each protrusion portion 144 is a distance from an outer surface of the first insulation layer 130 and an end of the protrusion portion 144. In some embodiments, the protrusion length D1 of each protrusion portion 144 is more than about 0.5 µm. In some embodiments, the protrusion length D1 of at least one of protrusion portions 144 is about 1 time to about 10 times the thickness T1 of the cover portion 142. For example, the protrusion length D1 of at least one of protrusion portions 144 may be between about 0.5 µm and about 20 µm.

Because a material characteristic varies with process conditions, material characteristics of the first insulation layer 130 and second insulation layer 140 may be different (even a material of the first insulation layer 130 is same as a material of the second insulation layer 140 in some embodiments). A crack may therefore occur between the first insulation layer 130 and the second insulation layer 140 due to the different material characteristics. For example, during a bonding process in FIG. 11, an imposing force may result in cracking or breaking between the first insulation layer 130 and the second insulation layer 140. A formation of the protrusion portions 144 with the protrusion length D1 more than about 0.5 µm may reduce possibilities of above-mentioned cracking or breaking, thereby enhancing reliability of manufacturing the light-emitting element 100.

The protrusion portions 144 have a third surface S3 and a fourth surface S4 opposite to each other, and the cover portion 142 has a fifth surface S5 and sixth surface S6 opposite to each other. In a case of the first surface S1 of the LED chip 110 as a reference surface, the third surface S3 is closer to the first surface S1 than the fourth surface S4, and the fifth surface S5 is closer to the first surface S1 than the sixth surface S6. In some embodiments, the fifth surface S5 physically contacts the second surface S2 of the LED chip 110.

In general, the protrusion portions 144 are closer to the first surface S1 of the LED chip 110 than the cover portion 142. In another words, the third surface S3 and the fourth surface S4 of the protrusion portions 144 are positioned between the first surface S1 of the LED chip 110 and the sixth surface S6 of the cover portion 142.

The protrusion portions 144 are further described according to some embodiments. In some cases, the third surface S3 is between the first surface S1 of the LED chip 110 and the second surface S2 of the LED chip 110. A distance between the third surface S3 of the protrusion portions 144 and the second surface S2 of the LED chip 110 may be the length L1. In some embodiments, the length L1 is between about 0.1 µm and about 4.5 µm. In some further embodiments, the length L1 is between about 0.2 µm and about 1.0 µm. Alternatively, a ratio of the length L1 to a thickness T3 of the LED chip 110 is in a range between about 0.02 and about 0.90. In further embodiments, a ratio of the length L1 to the thickness T3 of the LED chip 110 is in a range between about 0.04 and about 0.20.

The length L1 is the distance between the third surface S3 of the protrusion portions 144 and the second surface S2 of the LED chip 110 as well as a span of cover portion 142 disposed on the sidewalls W.

On the other hand, the fourth surface S4 of the protrusion portions 144 is between the first surface S1 of the LED chip 110 and the sixth surface S6 of the cover portion 142. A distance between the fourth surface S4 of the protrusion portions 144 and the sixth surface S6 of the cover portion 142 may be a length L2. In some embodiments, the length L2 is between about 0.1 µm and about 4.5 µm. In some further embodiments, the length L2 is between about 0.2 µm and about 1.0 µm. Alternatively, a ratio of the length L2 to the thickness T3 of the LED chip 110 is between about 0.02 and about 0.90. In further embodiments, a ratio of the length L2 to the thickness T3 of the LED chip 110 is in between about 0.04 and about 0.20. In some embodiments, the length L2 is substantially same as the length L1.

The second insulation layer 140 may include dielectric material, such as silicon oxide, aluminum oxide, titanium oxide, hafnium oxide, silicon nitride, any suitable materials, or a combination thereof. In some embodiments, a material of the first insulation layer 130 may be different from a material of the second insulation layer 140. In some embodiments, the material of the first insulation layer 130 is same as the material of the second insulation layer 140. In some embodiments, the second insulation layer 140 includes silicon oxide.

Figure 1C:
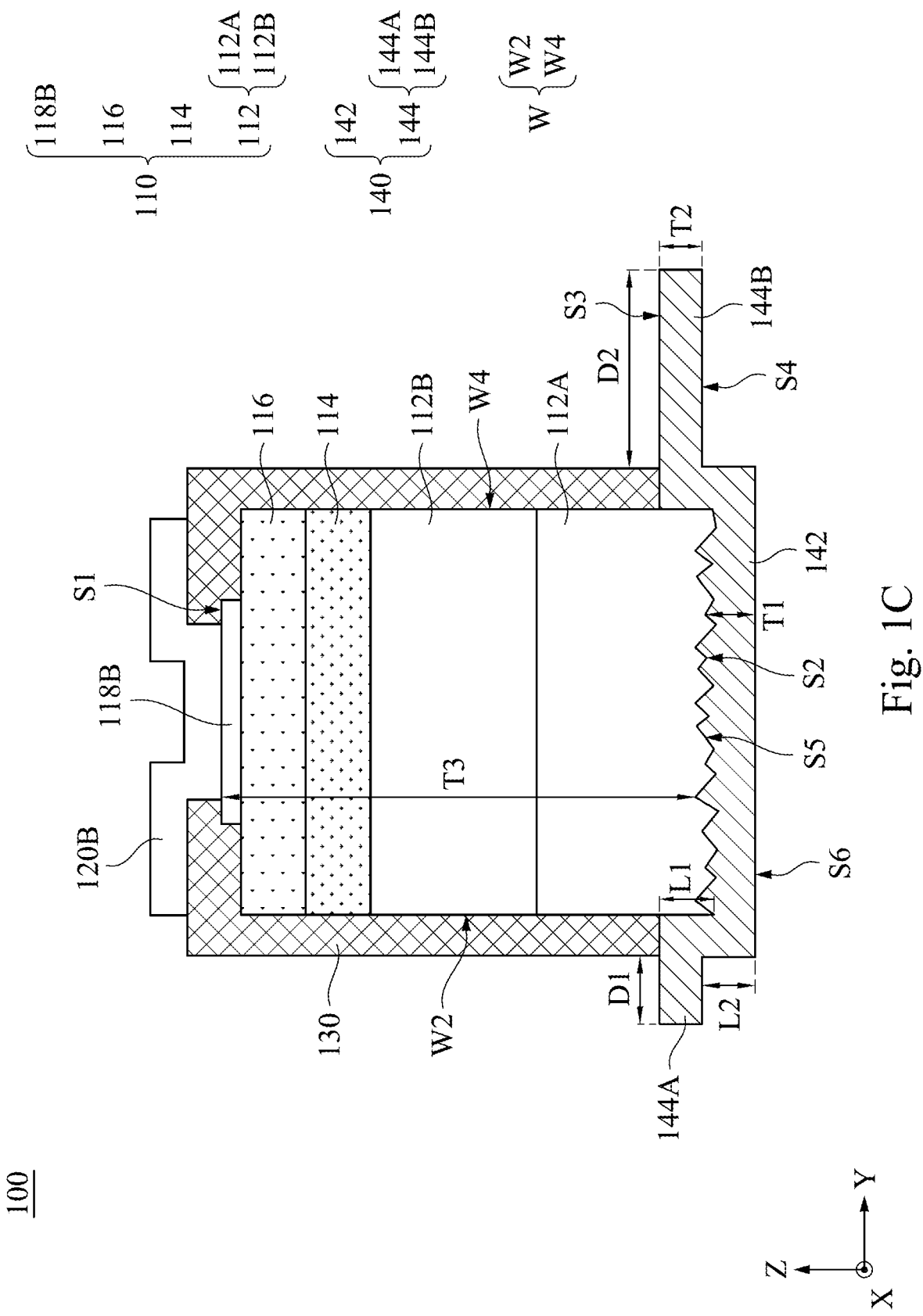
FIG. 1C is a cross-sectional view of the light-emitting element taken along line B-B of FIG. 1A according to some embodiments of the present disclosure.

Referring to FIG. 1A and FIG. 1C, FIG. 1A is a top view of a light-emitting element 100 according to some embodiments of the present disclosure, and FIG. 1C is a cross-sectional view of the light-emitting element taken along line B-B of FIG. 1A according to some embodiments of the present disclosure.

In some embodiments, the protrusion portions 144 with various protrusion lengths are disposed on the respective sidewalls W. In another words, the protrusion lengths of at least two of the protrusion portions 144 are different. In some further embodiments, a difference of protrusion length between at least two of the protrusion portions 144 is at least 1 µm.

Take the embodiment as shown in FIG. 1A and FIG. 1C as an example, a protrusion length D2 of a protrusion portion 144B configured on the sidewall W4 is larger than the protrusion length D1 of a protrusion portion 144A configured on the sidewall W2 by at least about 1 µm.

In the embodiment of the protrusion portion 144B with longer protrusion length D2, the protrusion length D2 of the protrusion portion 144B is about 1 time to about 10 times the thickness T1 of the cover portion 142. For instance, as the thickness T1 of the cover portion 142 is between about 0.5 µm and about 2.0 µm, the protrusion length D2 of the protrusion portion 144B may be between about 0.5 µm and about 20 µm.

During manufacturing the light-emitting element 100, the protrusion portion 144B with the longer protrusion length D2 may serve as a tether (e.g., a tether 1304 in FIG. 14), and the protrusion length D2 may basically be a length of the tether. In the following process such as in FIG. 14, when the light-emitting element 100 is stamped to break the protrusion portion 144B, a suitable protrusion length D2 may affect the stamping performance. If the protrusion length D2 is too short (e.g., less than about 0.5 µm), a torque caused by stamping may be too low to provide enough force to break the protrusion portion 144B. If the protrusion length D2 is too long (e.g., more than about 20 µm), the torque caused by stamping may be so high that the light-emitting element 100 deviates from the expected position where the light-emitting element 100 may be disposed. Therefore, forming a suitable protrusion length D2 may increase reliability of manufacturing the light-emitting element 100.

Differences between the protrusion portion 144B disposed on sidewall W4 and the protrusion portion 144A disposed on sidewall W2 are choice of sidewall and protrusion lengths. Other characteristics such as the third surface S3, the thickness T2, and the like are substantially the same for the protrusion portion 144B and the protrusion portion 144A.

FIG. 2 to FIG. 16 are cross-sectional views of the light-emitting element 100 in intermediate stages with reference cross section taken along line B-B of FIG. 1A according to some embodiments of the present disclosure.

While FIG. 2 to FIG. 16 are illustrated and described below as a series of acts or events, it will be appreciated that the illustrated ordering of such acts or events are not to be interpreted in a limiting sense. For example, some acts or events may occur in different orders, not be implemented and/or occur concurrently with other acts or events. Moreover, it is understood that additional processes can be provided before, during, and/or after manufacturing the light-emitting element 100 in order to produce the light-emitting element 100. Accordingly, some other processes may be briefly described herein. Further, the discussion of elements in FIG. 1A to FIG. 16 with the same annotations applies to each other, unless mentioned otherwise.

Figure 2:
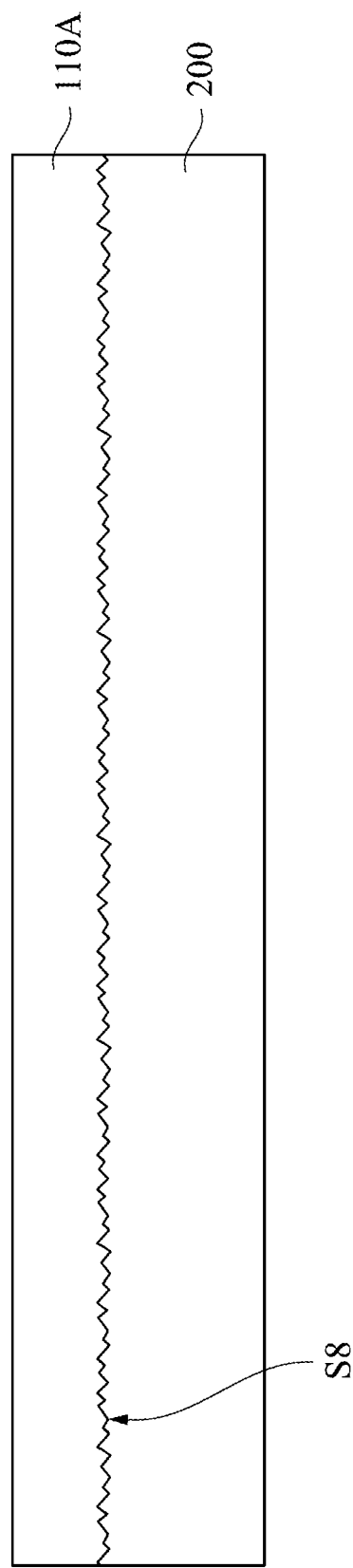

Referring to FIG. 2, a substrate 200 is prepared in the beginning. A light-emitting diode (LED) material 110A is formed on the substrate 200. The substrate 200 physically contacts an eighth surface S8 of the LED material 110A. A profile of the eighth surface S8 of the LED material 110A can be determined by a surface profile of the substrate 200 (discussed later). In an embodiment shown as FIG. 2, the eighth surface S8 is illustrated as a rough texture, but the present disclosure is not limited thereto. In other embodiments, the eighth surface S8 can be a flat surface.

The LED material 110A can be a multilayer structure, including a material of above-mentioned the first semiconductor layer 112 (not illustrated), a material of the light-emitting layer 114 (not illustrated), a material of the second semiconductor layer 116 (not illustrated), and the like. The following illustrations have been simplified (e.g., the multilayer structure is shown in a form of single layer) for the sake of clarity to better understand the inventive concepts of the present disclosure.

The substrate 200 can include a sapphire substrate, a gallium nitride substrate, an aluminum nitride substrate, a silicon substrate, a gallium arsenide substrate, a silicon carbide substrate, or other suitable substrates. In some embodiments, the substrate 200 can be a growth substrate for the LED chip 110, and in such embodiments, the substrate 200 can usually include the sapphire substrate. If the substrate 200 is performed as the growth substrate, the surface profile of the substrate 200 can be flat or rough. The LED material 110A subsequently formed on the substrate 200 may has a surface profile (e.g., the profile of the eighth surface S8) similar to the surface profile of the substrate 200.

Figure 3:
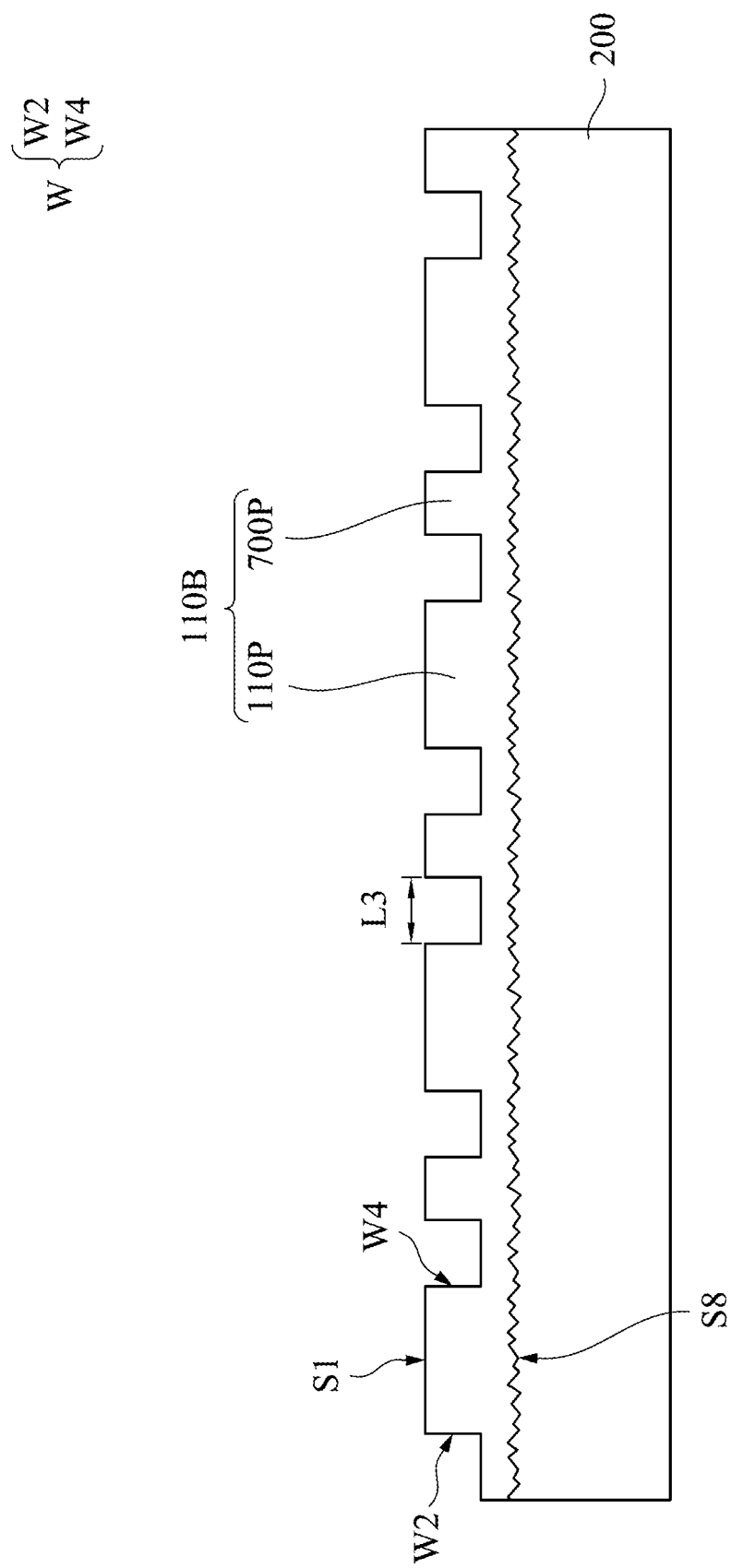

Referring to FIG. 3, subsequently, a patterned LED material 110B is formed. A portion of the LED material 110A is removed by conducting a patterning process on the LED material 110A, and becomes the patterned LED material 110B. The patterned LED material 110B includes a LED-chip profile 110P as a former stage of the LED chip 110, such as the first surface S1 and the sidewalls W (the sidewall W2 and W4 due to the observation direction in FIG. 3). In additions, the patterned LED material 110B further includes an anchor profile 700P as a former stage of an anchor 700 (in FIG. 7), connecting the LED-chip profile 110P.

The anchor profile 700P can be adjacent to at least two LED-chip profiles 110P. In FIG. 3, the anchor profile 700P is adjacent to two LED-chip profiles 110P, and one of these two LED-chip profiles is separated from the anchor profile 700P with a length L3. The length L3 may be determined by the product design and process requirements. Generally speaking, the length L3 is assigned to have enough length to ensure the subsequently-formed light-emitting element 100 includes the protrusion length D2 with above-noted characteristics. In another words, the length L3 acts as former stage of protrusion length D2 and affects the final length of the protrusion length D2.

Figure 4:
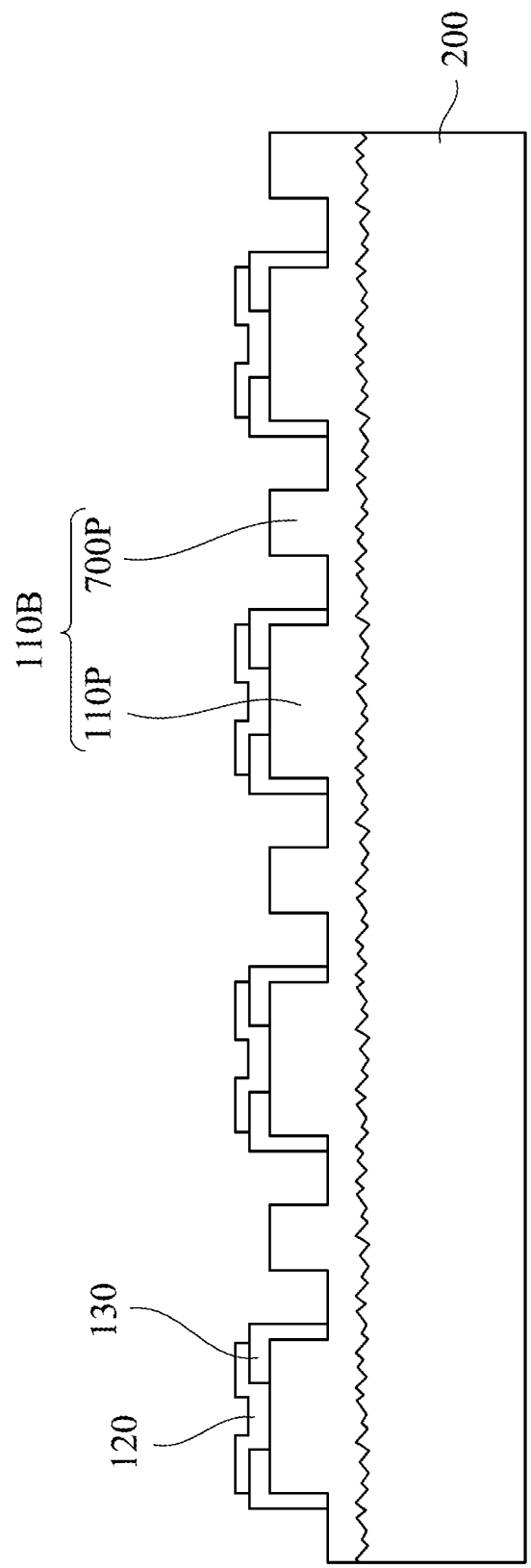

Referring to FIG. 4, subsequently, the first insulation layer 130 and the connection pads 120 are formed on the LED-chip profile 110P.

The first insulation layer 130 can be formed by a deposition process, a patterning process, an etching process, other suitable processes, or a combination thereof. The deposition process may include chemical vapor deposition (CVD) process, printing, coating, or other techniques. For example, a formation of the first insulation layer 130 includes depositing conformally a first insulation material (not illustrated) on the patterned LED material 110B, removing a portion of the first insulation material (not illustrated) with a patterned mask, and forming the first insulation layer 130 on the LED-chip profile 110P.

After the first insulation layer 130 is formed, the connection pads 120 are formed then. The connection pads may be formed in a similar way to the first insulation layer 130, including a deposition process, a patterning process, an etching process, other suitable processes, or a combination thereof. The deposition process may include sputter, evaporation, plating, or other suitable techniques.

Figure 5:
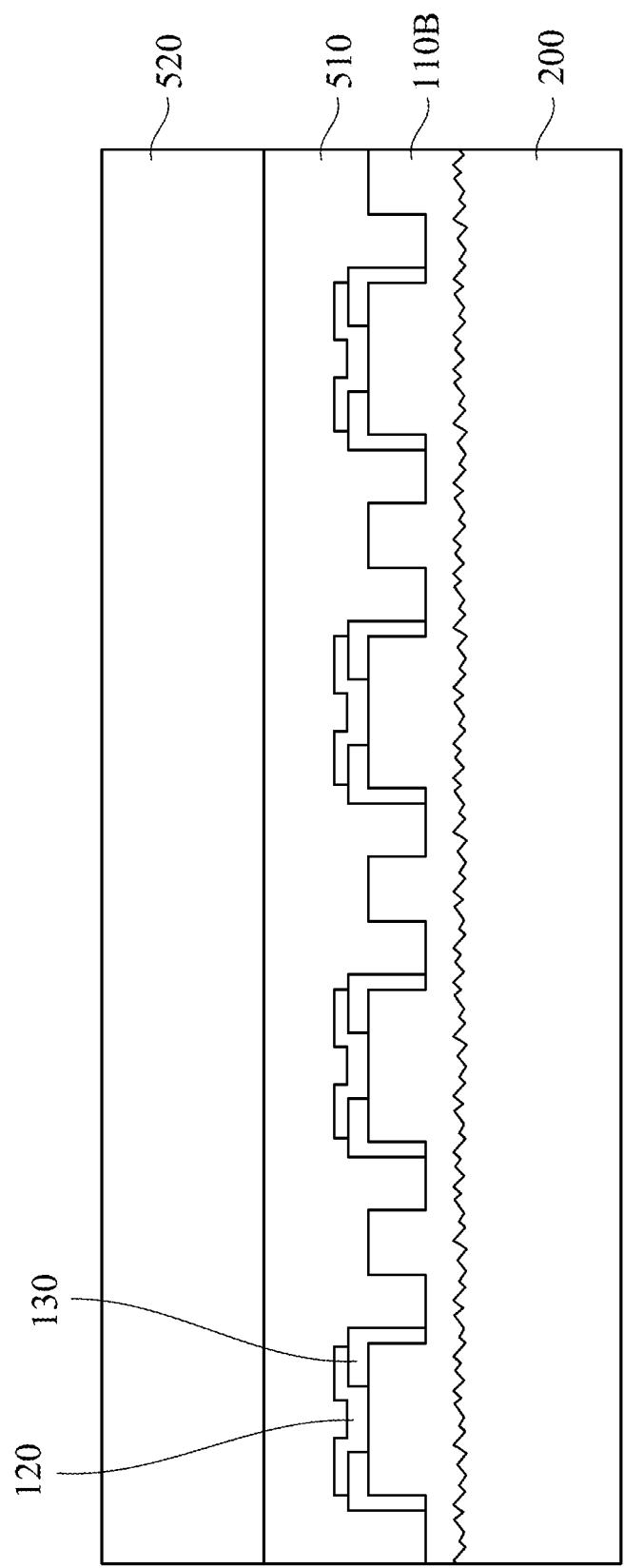

Referring to FIG. 5, subsequently, a first adhesion layer 510 and a first carrier substrate 520 are formed on the patterned LED material 110B. The first adhesion layer 510 is formed between the first carrier substrate 520 and the patterned LED material 110B, and consequently the first carrier substrate 520 can be bonded to the patterned LED material 110B with the first adhesion layer 510.

In some embodiments, the first adhesion layer 510 includes a material with different etching selectivity from patterned LED material 110B. For example, in the following removal process (e.g., in FIG. 7), a removal rate of the first adhesion layer 510 is faster than a removal rate of the patterned LED material 110B. Therefore, a height difference between the first adhesion layer 510 and the patterned LED material 110B can occur after the removal process (e.g., in FIG. 7). The first adhesion layer 510 may include benzocyclobutene (BCB), epoxy, silicone, polyimide (PI), poly (methyl 2-methylpropenoate) (PMMA), or other suitable adhesive materials, but the present disclosure is not limited thereto. In some embodiments, the first adhesion layer 510 is BCB. The first carrier substrate 520 can include a glass substrate, a silicon substrate, a sapphire substrate, or other suitable substrates.

Figure 6:
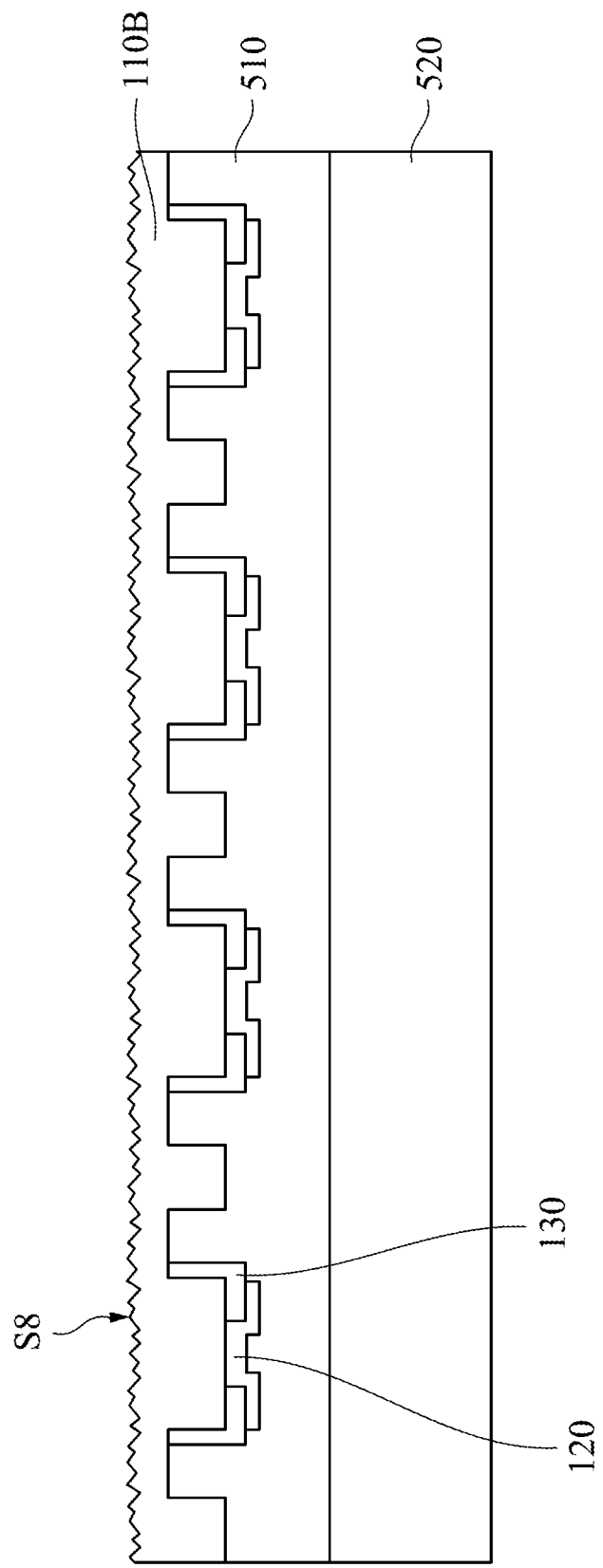

Referring to FIG. 6, subsequently, the substrate 200 is removed. The eighth surface S8 is exposed after removal of the substrate 200. To be understood, the structure in FIG. 6 is the structure in FIG. 5 with inverted and mirror-flipped. In some embodiments, the substrate 200 can be removed by any suitable methods, such as laser lift-off (LLO), polishing, etching, and the like.

Figure 7:
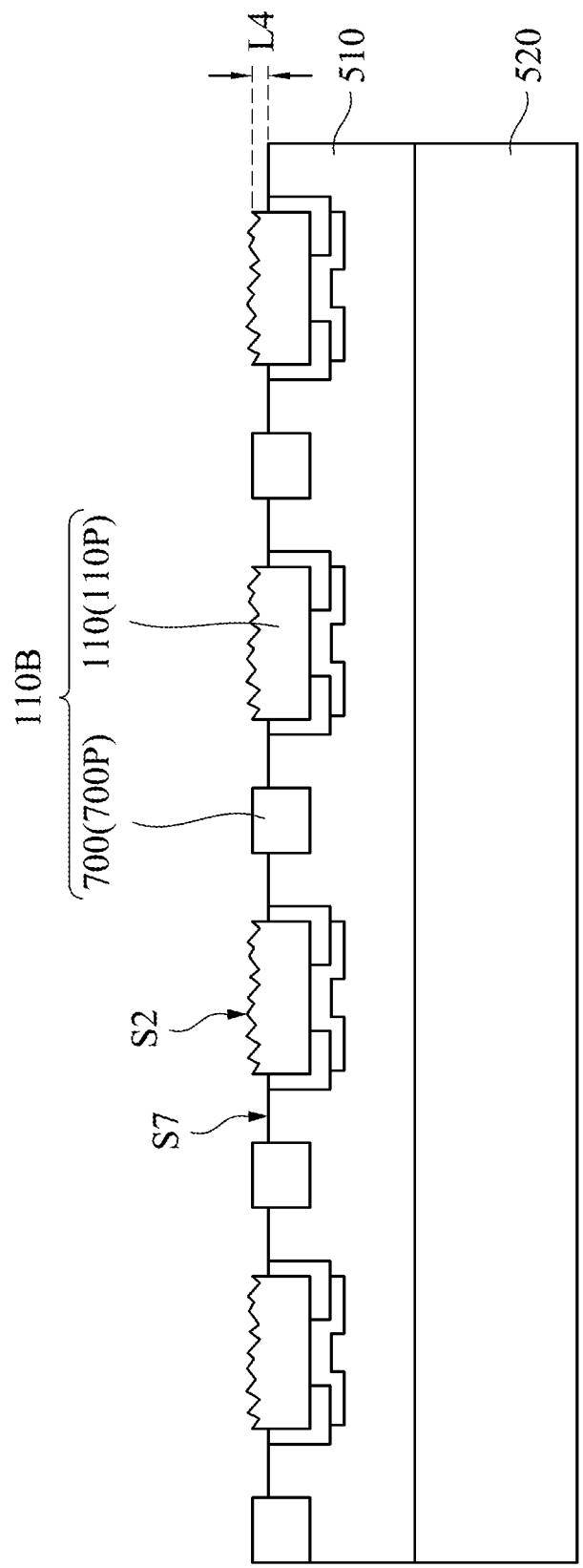

Referring to FIG. 7, subsequently, a portion of the patterned LED material 110B and a portion of the first adhesion layer 510 are removed.

In further descriptions of FIG. 7, the portion of the patterned LED material 110B is removed from eighth surface S8 to separate the LED-chip profile 110P and anchor profile 700P which originally are connected to each other. As a result, the separated LED-chip profile 110P and anchor profile 700P respectively become the LED chip 110 and anchor 700 without physically contacting to each other. The LED chip 110 has the second surface S2, and a profile of the second surface S2 may be similar to the profile of the eighth surface S8 in some embodiments. For example, the second surface S2 may remain flat or rough according to the eighth surface S8. In some embodiments where the second surface S2 is flat because of a flat surface profile of the eighth surface S8, a process to increase the roughness is performed on the second surface S2 for a rough texture thereon.

The removal process may include etching process or other suitable processes. A dry etching process, a wet etching process, and/or other techniques can be used in the etching process. In some embodiments, a dry etching process such as inductively coupled plasma (ICP) or reactive ion etching (RIE) may be used in the dry etching process. In some further embodiments, in order to boost the difference of the etching selectivity between the first adhesion layer 510 and the patterned LED material 110B, in addition to the choice of materials, a technique with a chemical etching is adopted in the dry etching process.

In some embodiments of the present disclosure, a combination of etchants used in the removal process and the material of the first adhesion layer 510 with large etching selectivity to the material of the patterned LED material 110B may result in a larger removal amount of the first adhesion layer 510 than a removal amount of the patterned LED material 110B during reaction in the removal process. In some embodiments, the second surface S2 of the LED chip 110 and a seventh surface S7 of the first adhesion layer 510 show non-coplanar. In another words, a height difference (e.g., a length L4) exists between the second surface S2 of the LED chip 110 and the seventh surface S7 of the first adhesion layer 510. In some embodiments, the length L4 is substantially same as the length L1 (see FIG. 1B). The above-mentioned height difference (e.g., the length L4) can facilitate controlling a breaking point of a tether (e.g., the tether 1304 in FIG. 14) close to an anchor portion (e.g., an anchor portion 1306 in FIG. 14). The predetermined breaking point may further have benefit of reliability enhancement. If the breaking point is near the LED chip 110, the second insulation layer 140 later formed may have a risk of cracking, and then the LED chip 110 may not be covered as expected. Impurities from the environments (e.g., water/humidity) may penetrate into the LED chip 110 and even degrade the LED chip 110 due to the crack in the second insulation layer 140. Therefore, controlling the breaking point away from the LED chip 110 (or close to the anchor portion as above-mentioned) may increase reliability of manufacture.

Figure 8:
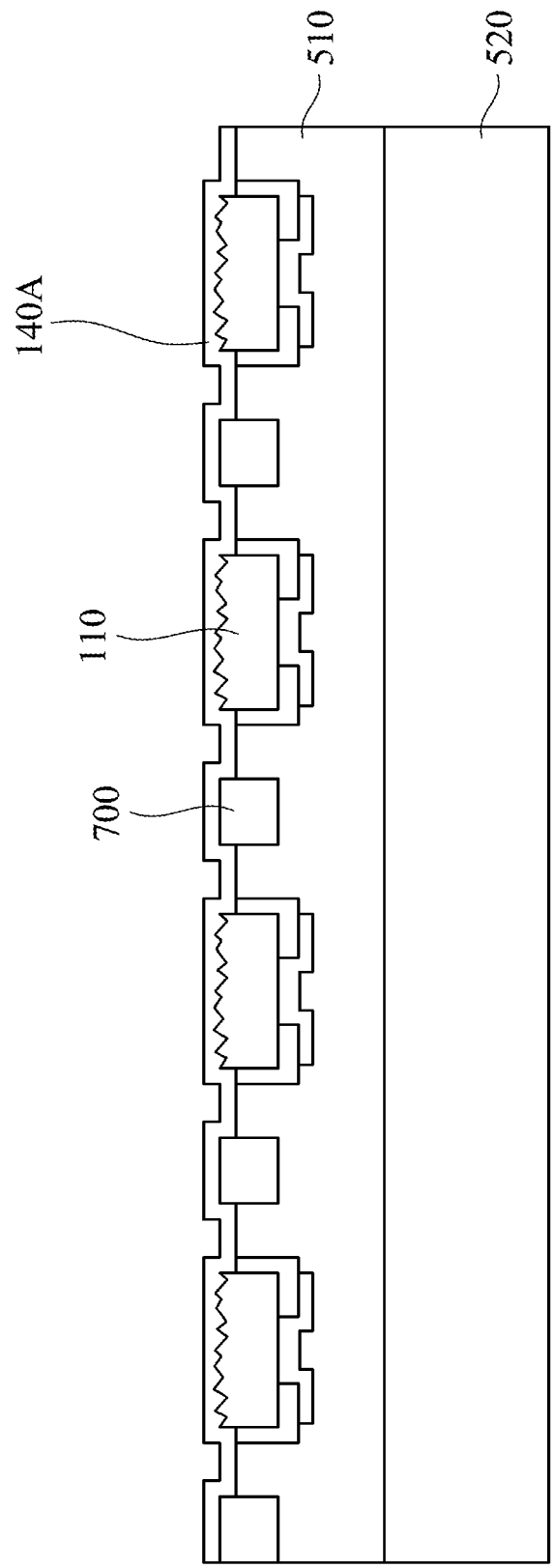

Referring to FIG. 8, subsequently, a second insulation layer material 140A is deposited on the LED chip 110, the anchor 700, and the first adhesion layer 510. In some embodiments, the second insulation layer material 140A covers conformally the LED chip 110, the anchor 700, and the first adhesion layer 510. The second insulation layer material 140A may be deposited by CVD process, printing, coating, or other techniques.

Figure 9:
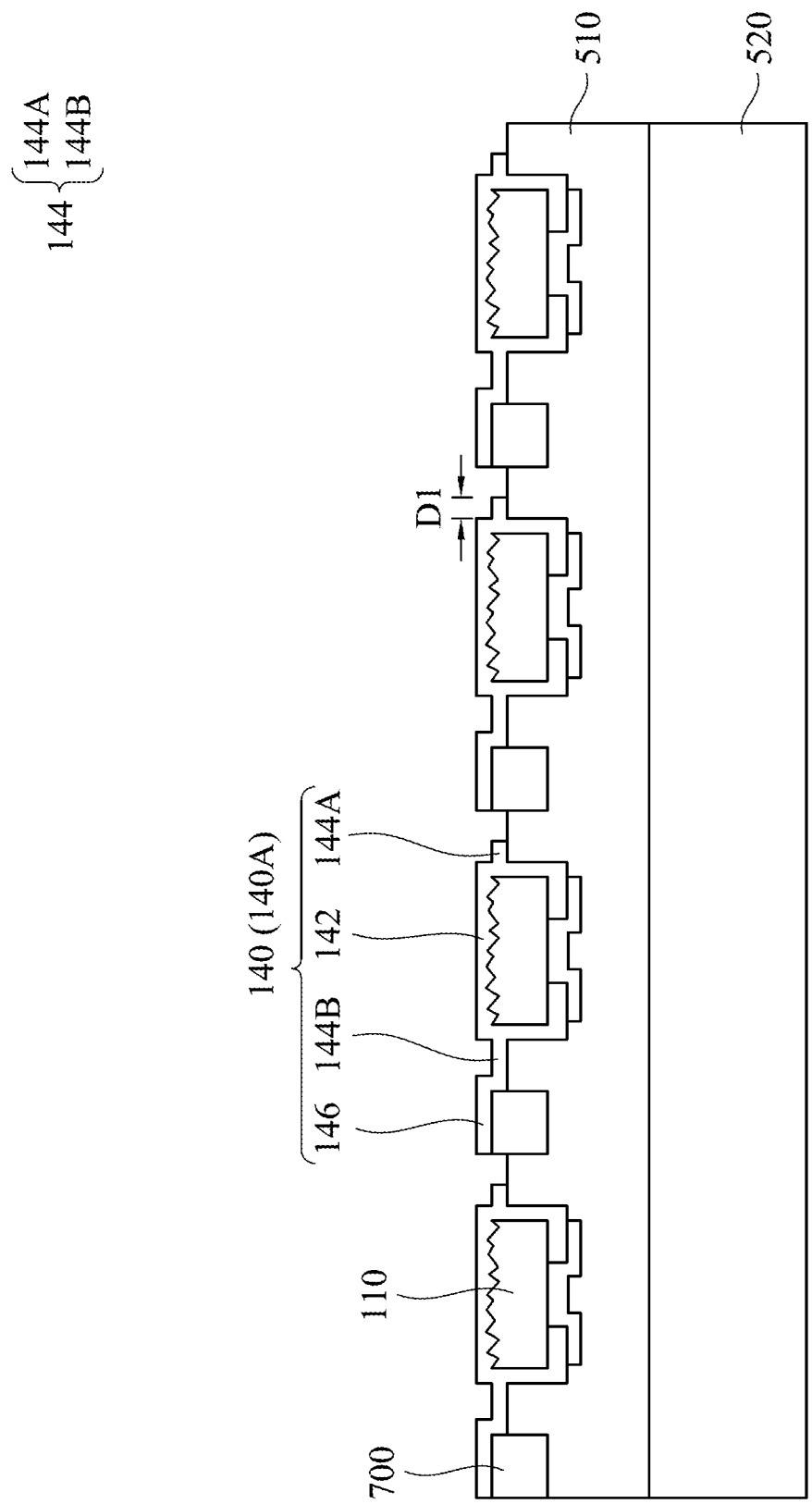

Referring to FIG. 9, subsequently, the second insulation layer 140 is formed. A portion of the second insulation layer material 140A is removed by conducting a patterning process to form the second insulation layer 140. In the embodiments as shown in FIG. 9, the second insulation layer 140 includes the cover portion 142, the protrusion portions 144 and an interface layer 146. The interface layer 146 is disposed on the anchor 700.

The protrusion portions 144 include the protrusion portion 144A and the protrusion portion 144B. The protrusion portion 144B connects and physically contacts the LED chip 110 and the anchor 700. With adjustment in a patterning process (such as a use of a suitable mask), a protrusion length of the protrusion portion 144A can be controlled. In some embodiments, the protrusion portion 144A is the protrusion length D1 as mentioned in previous description.

Figure 10:
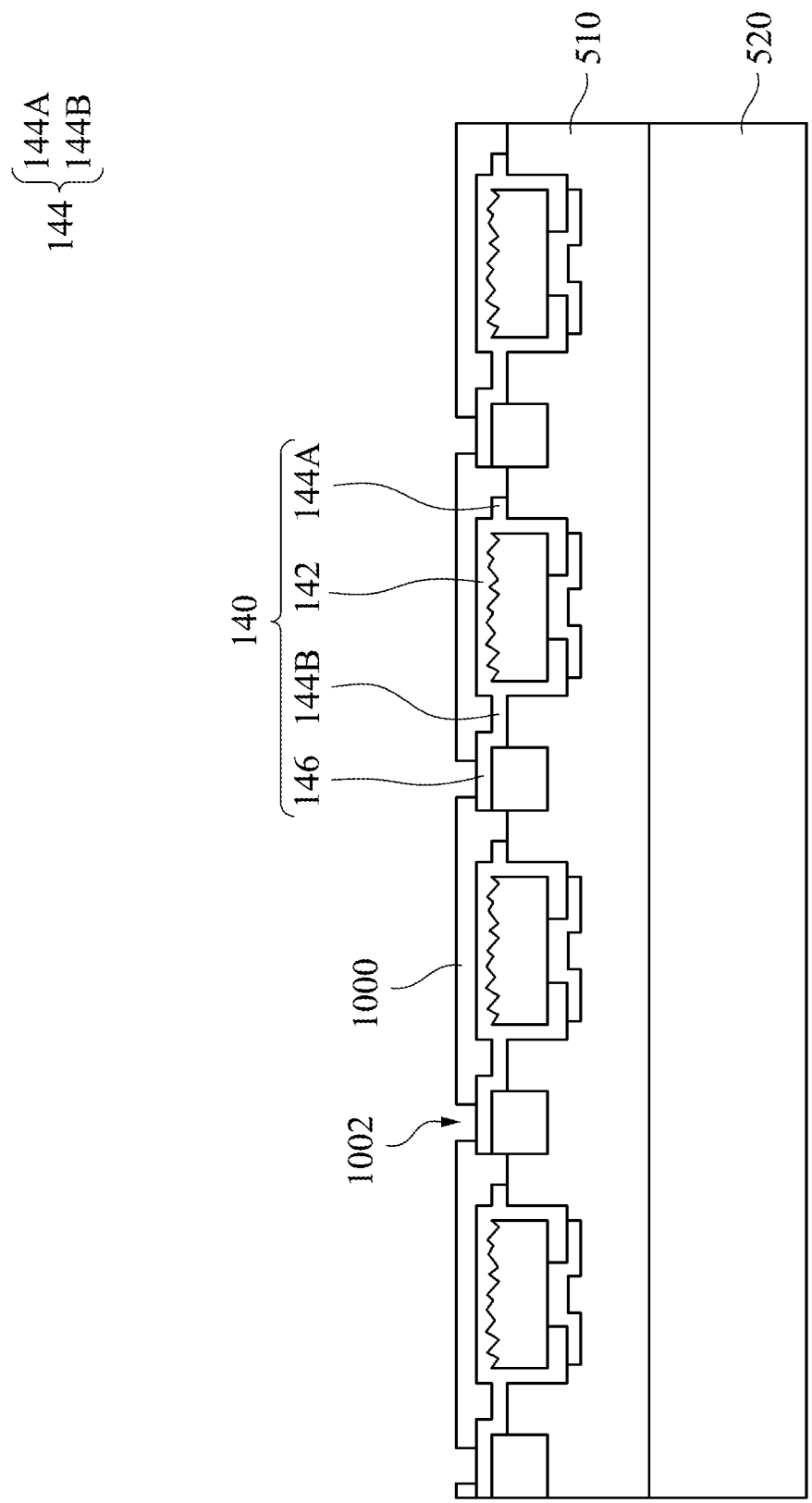

Referring to FIG. 10, subsequently, a sacrificial layer 1000 is formed on the first adhesion layer 510. Specifically speaking, the sacrificial layer 1000 covers the structure in FIG. 9, yet exposes at least a portion of interface layer 146 to form an opening 1002.

The sacrificial layer 1000 can be formed by a deposition process, a patterning process, an etching process, other suitable processes, or a combination thereof. In some embodiments, the sacrificial layer 1000 can include organic material, such as BCB, PI, and the like.

Figure 11:
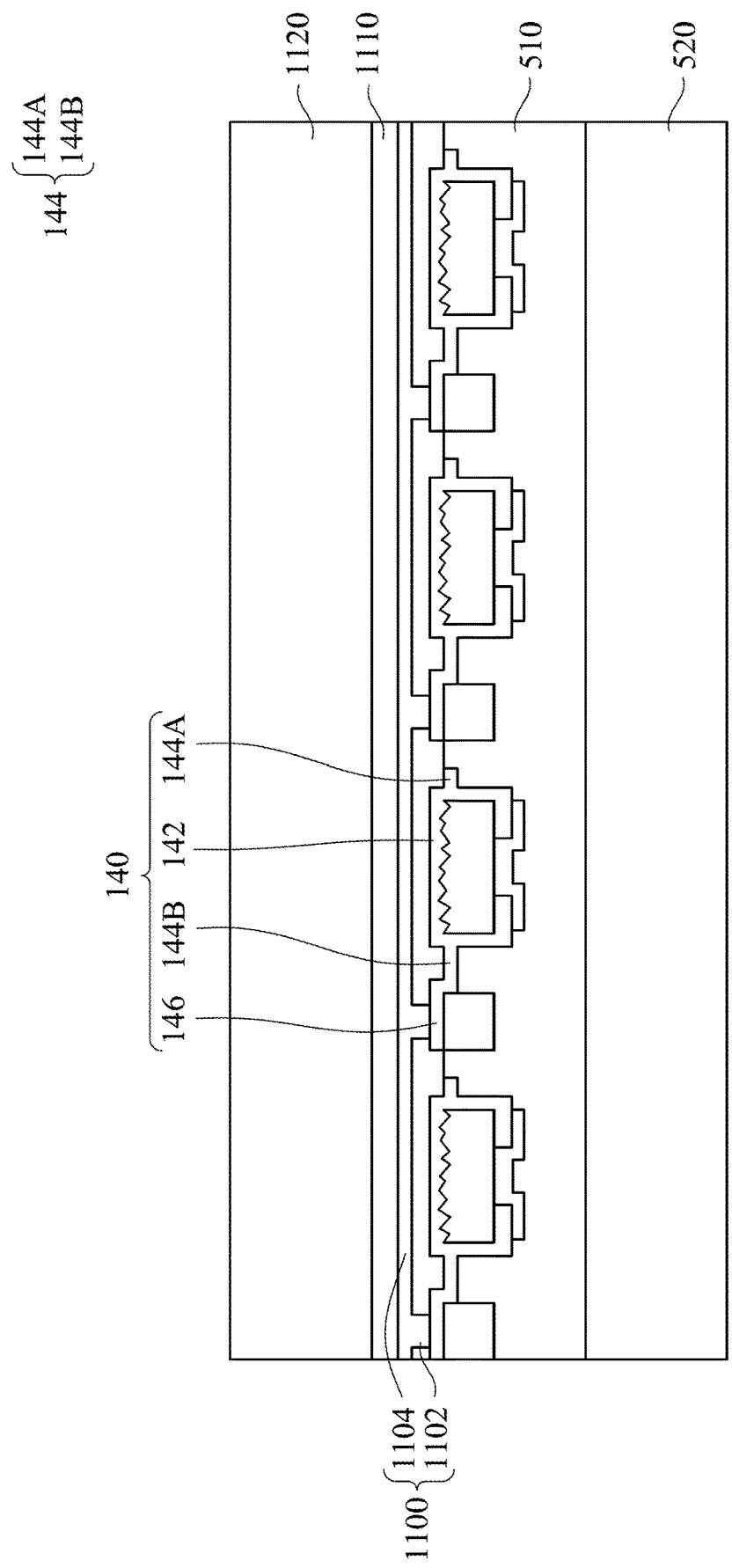

Referring to FIG. 11, subsequently, a support layer 1100, a second adhesion layer 1110 and a second carrier substrate 1120 are formed in sequence on the sacrificial layer 1000.

The support layer 1100 can include a base 1104 and a supporter 1102 which protrudes from the base 1104. The supporter 1102 is filled in the opening 1002 of FIG. 10 and in contact with the interface layer 146. In some embodiments, the supporter 1102 can be a cylinder or a polygon column. In some embodiments, the support layer 1100 may include insulating materials, metallic materials, or other supporting materials. For example, the insulating materials include silicon dioxide, silicon nitride, silicon oxynitride, and epoxy resin. The metallic materials include aluminum, titanium, platinum, or nickel, but not limited thereto.

The second adhesion layer 1110 is formed between the support layer 1100 and the second carrier substrate 1120, and consequently the second carrier substrate 1120 can be bonded to the support layer 1100 with the second adhesion layer 1110. The second adhesion layer 1110 may include BCB, epoxy, silicone, PI, PMMA, or other suitable adhesive materials, but the present disclosure is not limited thereto. The second carrier substrate 1120 may include a glass substrate, a silicon substrate, a sapphire substrate, a thin film transistor (TFT) substrate, or other suitable substrates.

Figure 12:
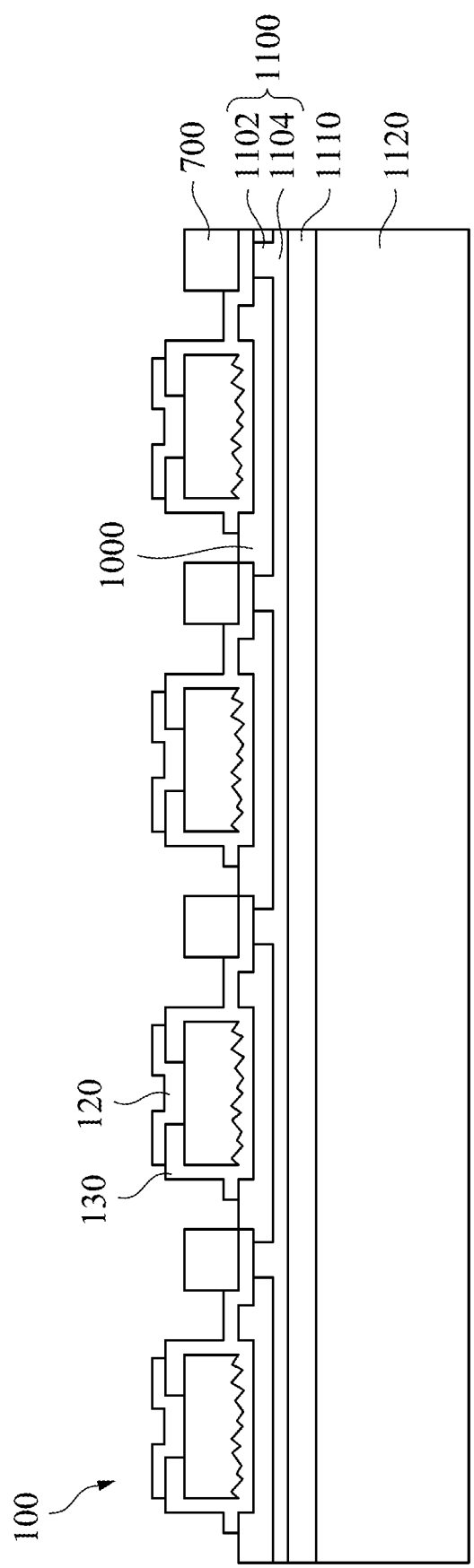

Referring to FIG. 12, subsequently, the first adhesion layer 510 and the first carrier substrate 520 are removed. The connection pads 120 and the first insulation layer 130 may be exposed after removal of the first adhesion layer 510 and the first carrier substrate 520. To be understood, the structure in FIG. 12 is the structure in FIG. 11 with inverted and mirror-flipped.

Figure 13:
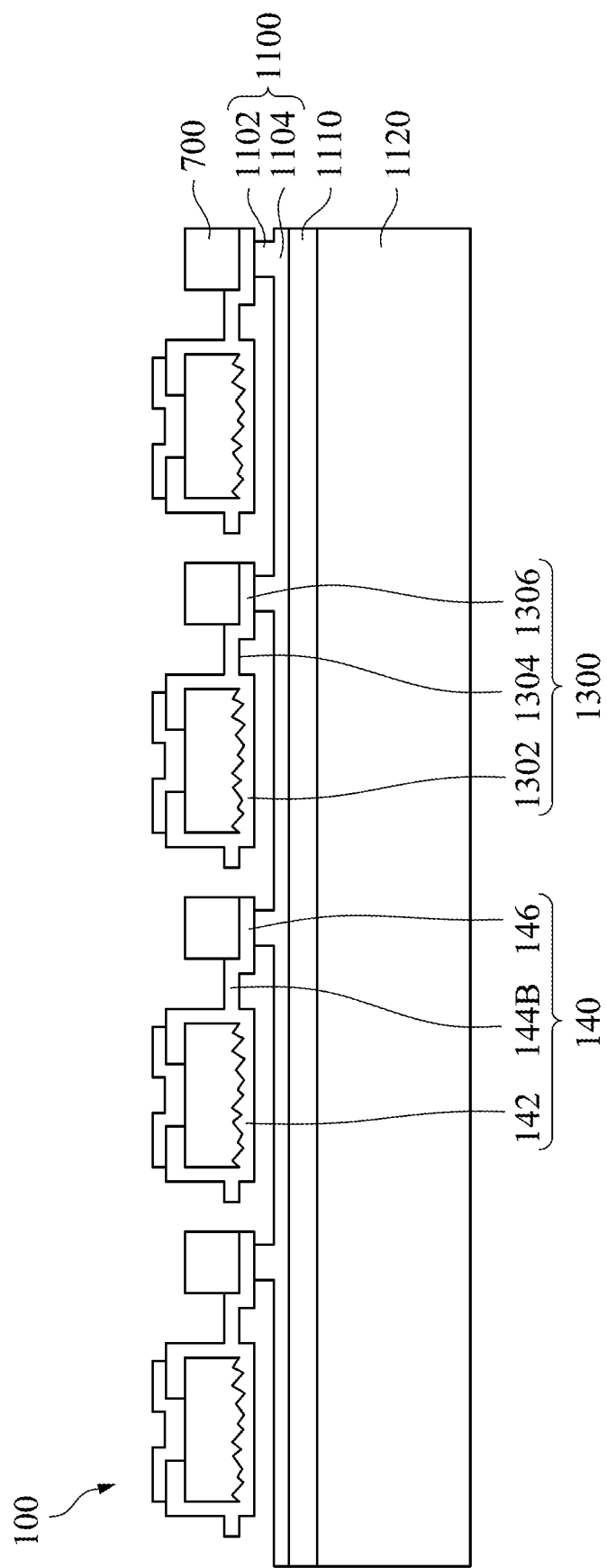

Referring to FIG. 13, subsequently, the sacrificial layer 1000 is removed. At least a portion of the sacrificial layer 1000 in contact with the supporter 1102 is removed such that the light-emitting element 100 is supported by the supporter 1102 and separated from the base 1104. In another words, a portion of the supporter 1102 is exposed and the light-emitting element 100 expected to be formed is suspended over the support layer 1100 by the supporter 1102 and the second insulation layer 140 after the sacrificial layer 1000 is removed. In some embodiments, space resulted from removal of the sacrificial layer 1000 may be enough for breaking and detaching the light-emitting element 100 from the supporter 1102 in the subsequent process.

For the process in FIG. 13, the second insulation layer 140 can also be used as a tether structure 1300 to support the light-emitting element 100. The cover portion 142 disposed on the second surface S2 acts as a device portion 1302 of the tether structure 1300. The longer protrusion portion 144B acts as the tether 1304 of the tether structure 1300. The interface layer 146 between the supporter 1102 and anchor 700 acts as the anchor portion 1306 of the tether structure 1300.

In some embodiments, the sacrificial layer 1000 can be removed by any suitable methods, such as using wet etching process. In some embodiments, a selective etching process is applied for removing the sacrificial layer 1000.

Figure 14:
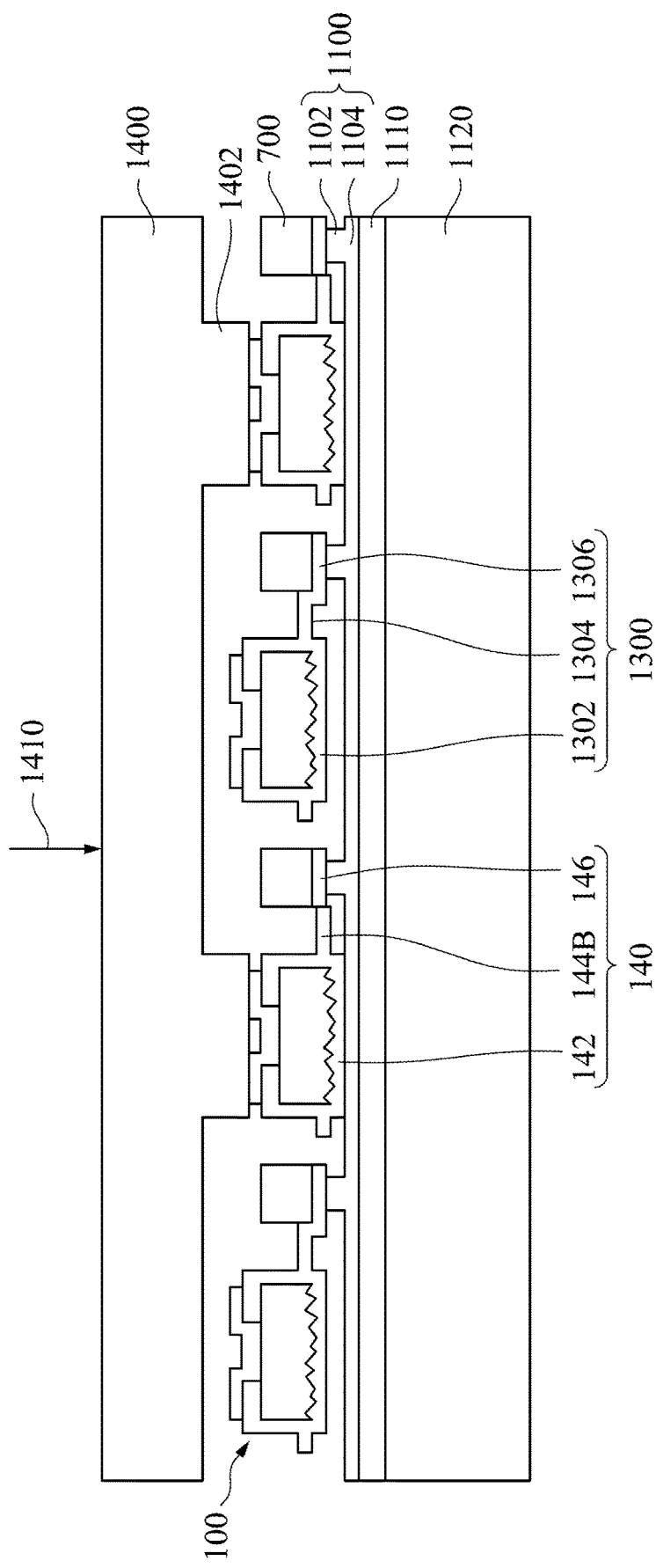

Referring to FIG. 14, subsequently, a transfer stamp 1400 is moved in a direction close to the second carrier substrate 1120 (e.g., a direction 1410) to press/stamp a number of the light-emitting element 100.

The tether 1304 of the tether structure 1300 breaks due to stamping of the transfer stamp 1300, such that the light-emitting element 100 is detached from the anchor portion 1306 of the tether structure 1300. In some embodiments, a breaking point of the tether 1304 is in close proximity to a sidewall of the anchor 700, and therefore the broken tether 1304 is regarded as the protrusion portion 144B of the light-emitting element 100. In some embodiments, a length of the tether 1304 substantially equals to the protrusion length D2 of the protrusion portion 144B.

In some embodiments, the transfer stamp 1400 may be a polydimethylsiloxane stamp (PDMS stamp). The transfer stamp 1400 includes multiple transfer ends 1402 each of which has an adhesive plane to temporarily attach the light-emitting element 100. An arrangement of transfer ends 1402 may be in an array so the transfer ends 1402 can be aligned with the light-emitting elements 100 one by one. In some embodiments, the transfer stamp 1400 can pick up all of the light-emitting elements 100. In some embodiments, the transfer stamp 1400 can selectively pick up some of the light-emitting elements 100. For example, the transfer stamp 1400 can pick up two of the light-emitting elements 100 in FIG. 14. In some other embodiments, the transfer stamp 1400 may be a vacuum-type transfer stamp and meanwhile the transfer ends 1402 may be vacuum-type transfer ends.

Figure 15:
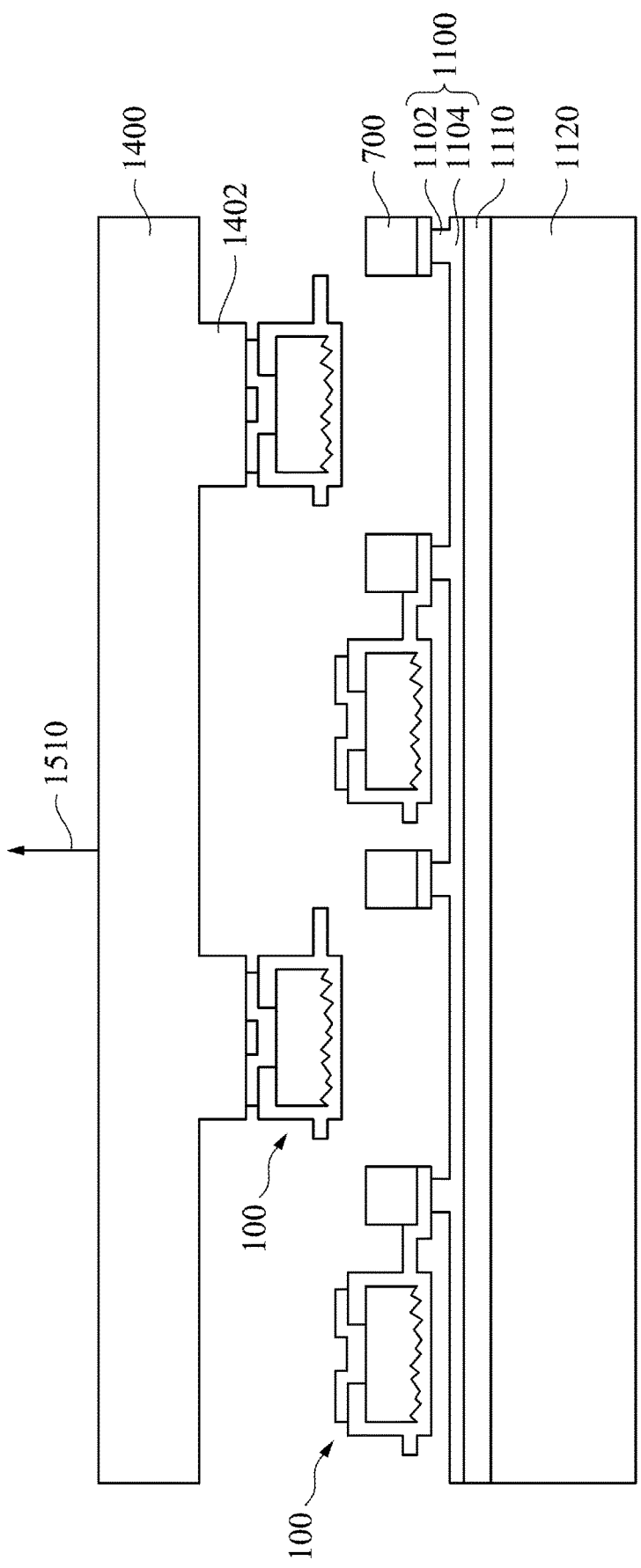

Referring to FIG. 15, subsequently, the transfer stamp 1400 is moved in a direction away from the second carrier substrate 1120 (e.g., a direction 1510), and the picked light-emitting element 100 in contact with the transfer ends 1402 is moved along with the transfer stamp 1400 and detached from the second carrier substrate 1120.

Referring to FIG. 16, substantially, the transfer stamp 1400 is moved to a third carrier substrate 1620 and places the light-emitting element 100 thereto. In the subsequent process, the light-emitting element 100 is further configured on the third carrier substrate 1620. The third carrier substrate 1620 may include a glass substrate, a silicon substrate, a sapphire substrate, a TFT substrate, or other suitable substrates. In some embodiments, the third carrier substrate 1620 is a TFT substrate. In some embodiments, an array of the light-emitting elements 100 is disposed on the TFT substrate to form a display device 1600.

The present disclosure discloses a structure of a light-emitting element with an insulation layer covering whole semiconductor surface of a LED chip to provide the light-emitting element with thorough protection and electrical insulation, thereby increasing reliability of the light-emitting element. In addition, a structure design of the insulation layer, such as a formation of protrusion portions and predetermined protrusion lengths, can increase reliability of manufacturing the light-emitting element.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting element, comprising:
   a light-emitting diode chip, having a first surface, a second surface opposite to the first surface, and a plurality of sidewalls connecting the first surface and the second surface;
   a first insulation layer, disposed on the first surface and the plurality of sidewalls, wherein the first insulation layer covers the first surface and a first part of the plurality of sidewalls;
   a plurality of connection pads, physically contacting the first surface and protruding from the first insulation layer; and
   a second insulation layer, disposed on the second surface and a second part of the plurality of sidewalls, wherein the second insulation layer includes:
      a cover portion, covering the whole second surface and the second part of the plurality of sidewalls; and
      a plurality of protrusion portions, disposed on the plurality of sidewalls, protruding from the cover portion and extending laterally, wherein the first insulation layer comprises no protrusion portions adjacent to the protrusion portions of the second insulating layer.

2. The light-emitting element of claim 1, wherein a protrusion length of at least one of the plurality of protrusion portions is about 1 time to about 10 times a thickness of the cover portion.

3. The light-emitting element of claim 1, wherein protrusion lengths of at least two of the plurality of protrusion portions are different.

4. The light-emitting element of claim 1, wherein a protrusion length of each of the plurality of protrusion portions is more than about 0.5 micrometers (μm).

5. The light-emitting element of claim 1, wherein the second surface of the light-emitting diode chip has a rough texture.

6. The light-emitting element of claim 1, wherein a material of the first insulation layer is different from a material of the second insulation layer.

7. The light-emitting element of claim 1, wherein a material of the first insulation layer is same as a material of the second insulation layer.

8. The light-emitting element of claim 1, wherein the second insulation layer comprises silicon oxide.

9. The light-emitting element of claim 1, wherein a thickness of the cover portion is in a range from about 0.5 μm to 2.0 μm.

10. The light-emitting element of claim 1, wherein a combination of the first part of the plurality of sidewalls and the second part of the plurality of sidewalls is entirety of the plurality of sidewalls.

11. The light-emitting element of claim 1, wherein each of the plurality of protrusion portions has a third surface and a fourth surface opposite to the third surface, wherein the third surface is closer to the first surface of the light-emitting diode chip than the fourth surface, and the third surface is between the first surface and the second surface of the light-emitting diode chip.

12. The light-emitting element of claim 11, wherein the cover portion has a fifth surface and a sixth surface opposite to the fifth surface, wherein the fifth surface is in contact with the second surface of the light-emitting diode chip, and the fourth surface of each of the plurality of protrusion portions is between the first surface of the light-emitting diode chip and the sixth surface of the cover portion.

13. A display device, comprising,
a carrier substrate; and
a plurality of the light-emitting elements of claim 1, disposed on the carrier substrate.

14. The display device of claim 13, wherein protrusion lengths of at least two of the plurality of protrusion portions of the light-emitting elements are different.

15. The display device of claim 13, wherein a combination of the first part of the plurality of sidewalls and the second part of the plurality of sidewalls is entirety of the plurality of sidewalls.

16. The display device of claim 13, wherein each of the plurality of protrusion portions of the light-emitting elements has a third surface and a fourth surface opposite to the third surface, wherein the third surface is closer to the first surface of the light-emitting diode chip than the fourth surface, and the third surface is between the first surface and the second surface of the light-emitting diode chip.

17. The display device of claim 13, wherein a protrusion length of each of the plurality of protrusion portions of the light-emitting elements is about 1 time to about 10 times a thickness of the cover portion.

18. The display device of claim 17, wherein the thickness of the cover portion is in a range from about 0.5 μm to 2.0 μm.

* * * * *